United States Patent [19]
Wu

[11] Patent Number: 6,008,529
[45] Date of Patent: Dec. 28, 1999

[54] LASER DIODE PACKAGE

[75] Inventor: Jiahn-Chang Wu, Hsin-Chu, Taiwan

[73] Assignee: Bily Wang, Hsin-Chu, Taiwan

[21] Appl. No.: 09/104,762

[22] Filed: Jun. 25, 1998

[51] Int. Cl.⁶ .......................... H01L 23/495; H01L 23/02
[52] U.S. Cl. .......................... 257/676; 257/678; 257/698; 257/670
[58] Field of Search ..................................... 257/676, 678, 257/698, 670, 99, 787, 100, 778

[56] References Cited

U.S. PATENT DOCUMENTS

| | | | |
|---|---|---|---|
| 5,220,195 | 6/1993 | McShane et al. | 257/666 |
| 5,629,952 | 5/1997 | Bartholomew et al. | 257/678 |
| 5,689,091 | 11/1997 | Hamzehdoost et al. | 257/700 |
| 5,767,528 | 6/1998 | Suni et al. | 257/778 |
| 5,773,879 | 6/1998 | Fusayasu et al. | 257/678 |

*Primary Examiner*—Mahshid Saadat
*Assistant Examiner*—Jhihan B Clark
*Attorney, Agent, or Firm*—H. C. Lin, Patent Agent

[57] ABSTRACT

A surface mount semiconductor laser diode package has a substrate on which the laser diode is mounted. The top electrode of the laser diode is wire-bonded to the top end of a plated-through conduit through the substrate, and the bottom end of the plated-through conduit is connected to a circuit contact plated at the bottom surface of the substrate. The bottom electrode of the laser diode is flip-chip mounted to the top end of another plated-through conduit, and bottom end of the second plated-through conduit is connected to a second circuit contact. Each laser diode is covered with a transparent lid or a lid with a lens. For mass production, a large number of the laser diodes arranged in a matrix formation are mounted on a common substrate. Walls are erected around each laser diode. A transparent cover is placed over the walls. All the plated-through conduits at the edges of the laser diodes in a same column are aligned and sawed through together.

15 Claims, 8 Drawing Sheets

LASER DIODE PACKAGE

BACKGROUND OF THE INVENTION

This invention is related to a semiconductor package, in particular to a surface mount package for a laser diode.

Conventional laser diode package has a an metallic exterior and the terminals are protruded outside the package. The package occupies a large volume, which is undesirable.

SUMMARY

An object of this invention is to miniaturize a surface mount laser diode package. Another object of this invention is to provide a laser diode package suitable for mass production.

These objects are achieved by providing two plated-through conduits through a substrate on which the laser diode is mounted. One plated-through conduit has its top end extended to a bonding pad to which the top electrode of the laser diode is wire-bonded, and its bottom end connected to a circuit contact at the bottom of the substrate. Another plated-through conduit has its top end extended to another bonding pad to which the bottom electrode of the laser diode is flip-chip bonded, and its bottom end connected to another circuit contact at the bottom of the substrate. Each laser diode is enclosed with four walls and covered with a transparent lid or a lid with a lens.

In mass production, a common substrate is used to mount a matrix of laser diodes with the plated-through conduits aligned. Walls are first erected and then covered with a transparent lid. The structure is sawed through the plated-through conduits along the same column and then sawed row by row to yield individual dice.

BRIEF DESCRIPTION OF THE INVENTION

DETAILED DESCRIPTION OF THE PREFERRED EMBODIMENT

Figure 1A:
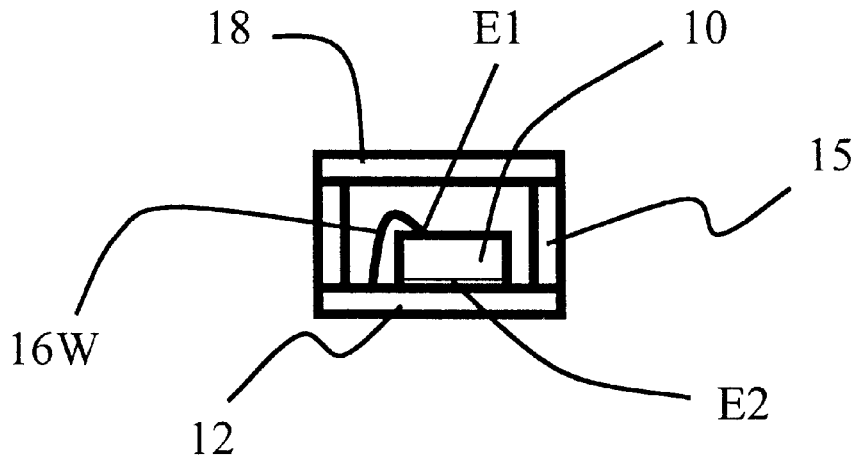
FIG. 1A shows the cross-sectional view of the laser diode package based on the present invention.

FIG. 1A shows the cross-sectional view of a laser diode package based on the present invention. A laser diode 10 has a top electrode E1 and a bottom electrode E2. The top electrode E1 is wire bonded by wire 16W to a conducting bonding pad on top of the substrate 12. The a second bottom electrode E2 is flip-chip bonded to another conducting bonding pad on the substrate 12. The side wall 15 and a transparent cover 28 encloses the laser diode 10 to constitute a single laser diode unit.

Figure 1B:
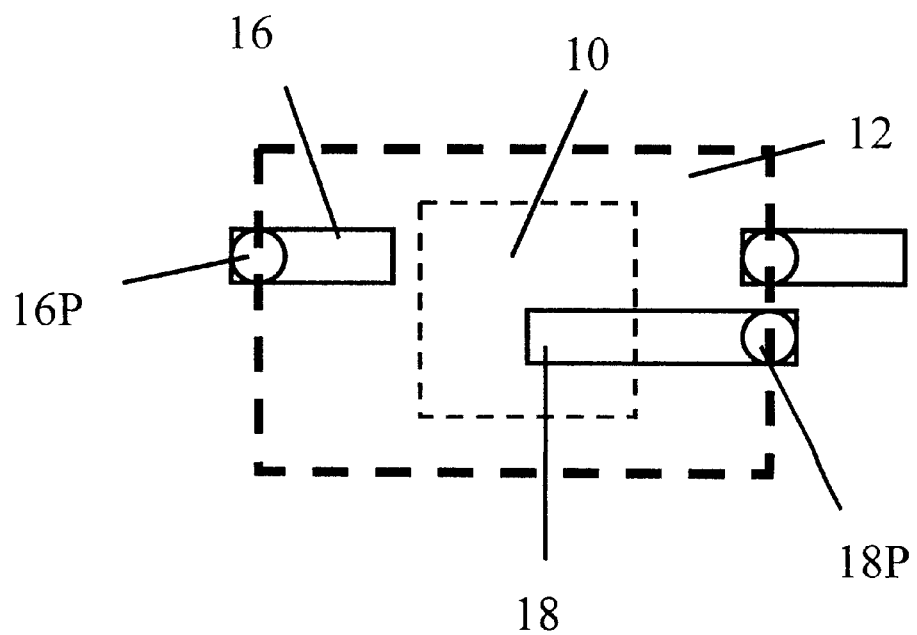
FIG. 1B shows the top view of the package relative to the placement of the laser diode and the terminals on a substrate.

FIG. 1B shows the surface of the substrate 12 for the structure shown in FIG. 1A. The substrate 12 has a bonding pad 16 printed on top of the substrate 12. The bonding pad 16 is wire bonded to the top electrode E1 and fed through a plated-through conduit 16P to a circuit contact at the bottom of the substrate 12 serving as a first output terminal. The bottom electrode E2 of the laser diode is flip-chip bonded to another bonding pad 18 which is also connected to the bottom of the substrate 12 through another plated-through hole 18P to another circuit contact at the bottom of the substrate 12, serving as the second output terminal of the laser diode.

Figure 2A:
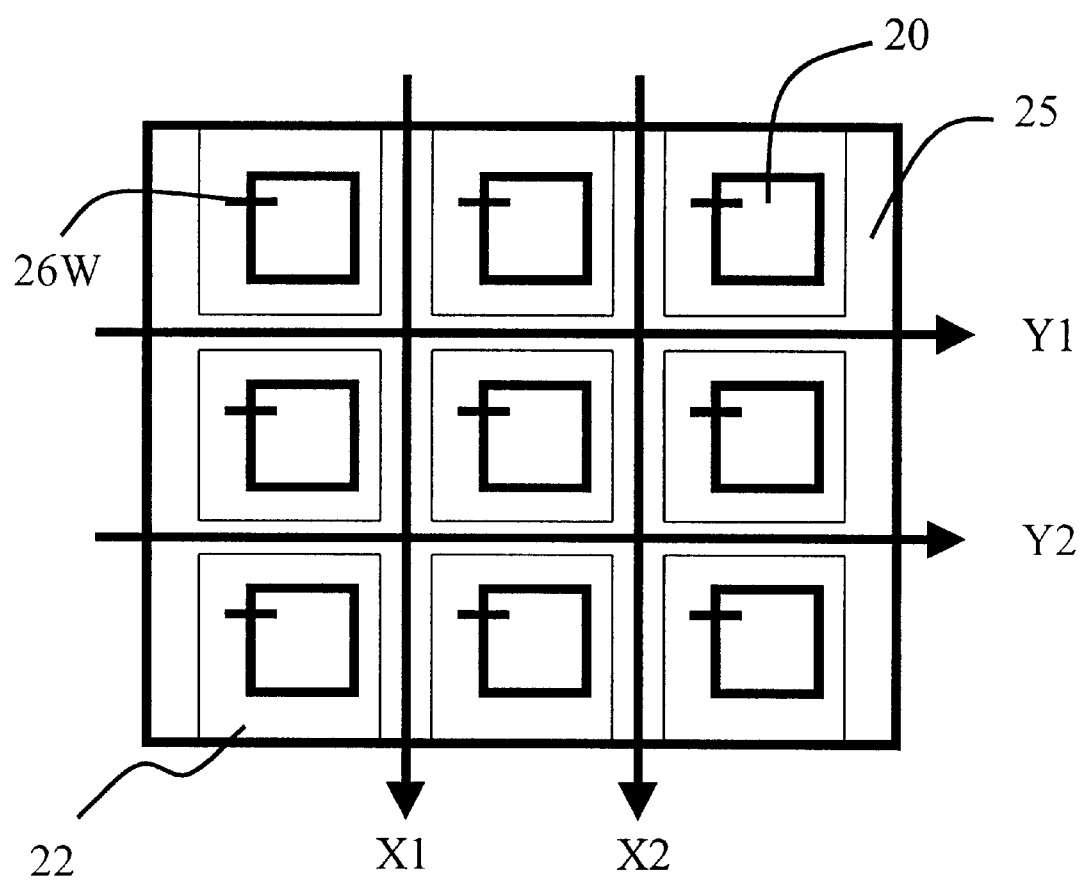
FIG. 2A shows a mass production arrangement of a matrix of the laser diode packages.
Figure 2B:
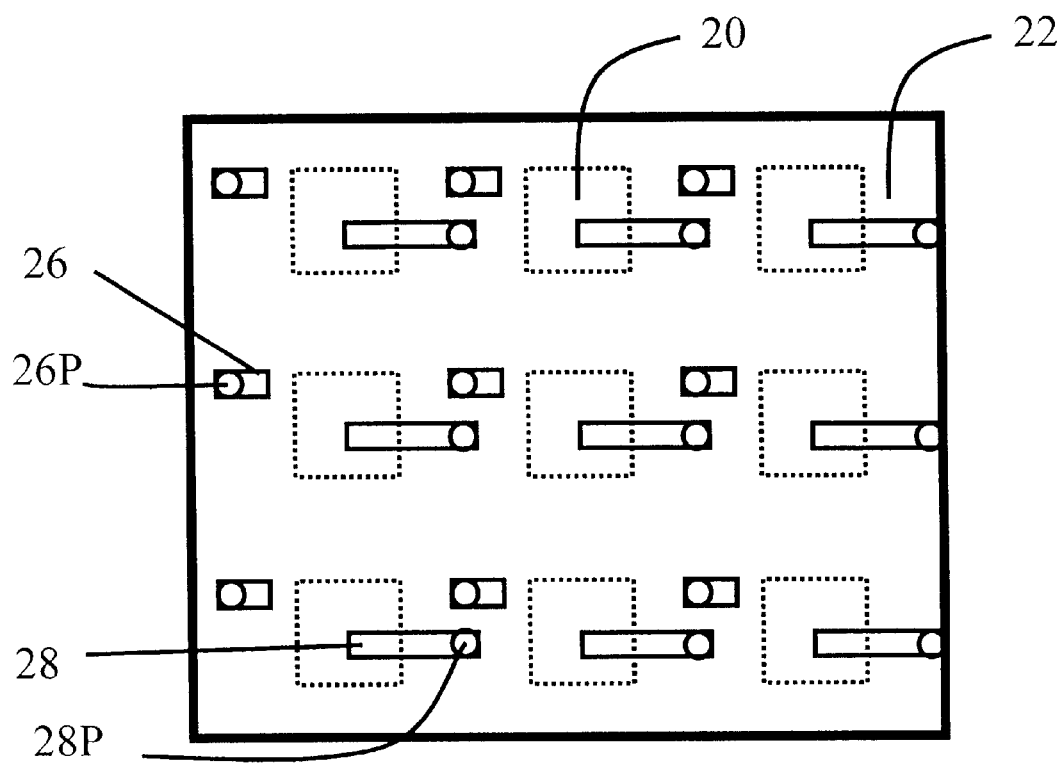
FIG. 2B shows the top view of the mass produced laser diode packages.
Figure 2C:
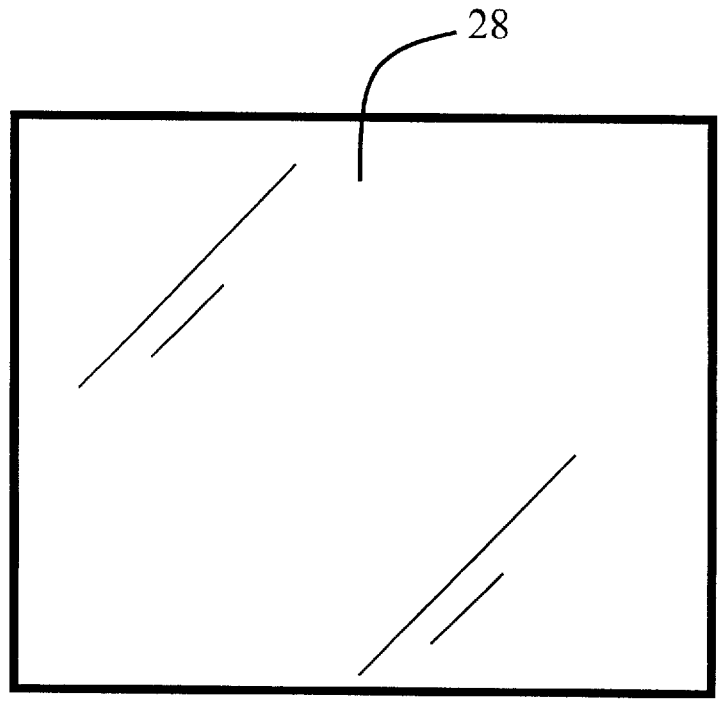
FIG. 2C shows a transparent cover for the mass produced laser diode package matrix.

FIG. 2A shows a layout for mass production of the laser diodes of the present invention. A common substrate 22 is first erected with side walls 25 to separate a matrix of laser diodes 20. Each laser diode is glued to the substrate with conductive epoxy for flip-chip bonding to a common substrate 22. The first electrode E1 is wire bonded by wire 26W for connection to the bottom contact of the substrate 22. Finally, a transparent cover is used to cover over the entire substrate, by gluing over the side walls 25 to protect the device from dust as shown in FIG. 2C. The structure is then diced along the bands X1, X2, Y1, Y2 to yield a large number of laser diodes.

FIG. 28 shows the top view of the substrate 22 in mass production. The substrate 22 has a large number of bonding pads 26 for the first electrodes E1, which are connected to the bottom contacts through the plated-through conduit 26P serving as the output terminals for the first electrodes of the laser diodes. The top of the substrate 22 also has second bonding pads 28, each flip-chip bonded to the second electrode E2 of the laser diode and fed through the plated-through conduit 28P to the bottom of the substrate 22. The plated-through conduits within each package as well as all the packages along a same column are aligned for the convenience of sawing.

FIG. 2C shows a transparent cover 28 for the mass produced laser diode packages. This cover rests on top of the laser diode packages. After dicing, the cover is separated into individual covers for the laser diode package.

Figure 2D:
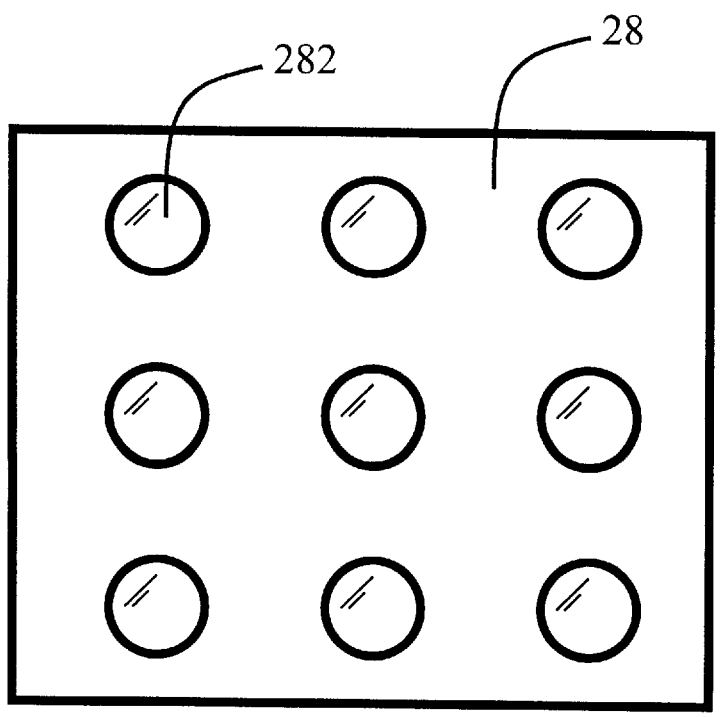
FIG. 2D shows the cover for the laser diode matrix with transparent lenses.

FIG. 2D shows a transparent cover 28 with lenses 282. These lenses serve to focus the light radiating from the laser diode. Conversely, the lenses can be defocusing lenses to produce divergent light rays.

Figure 3A:
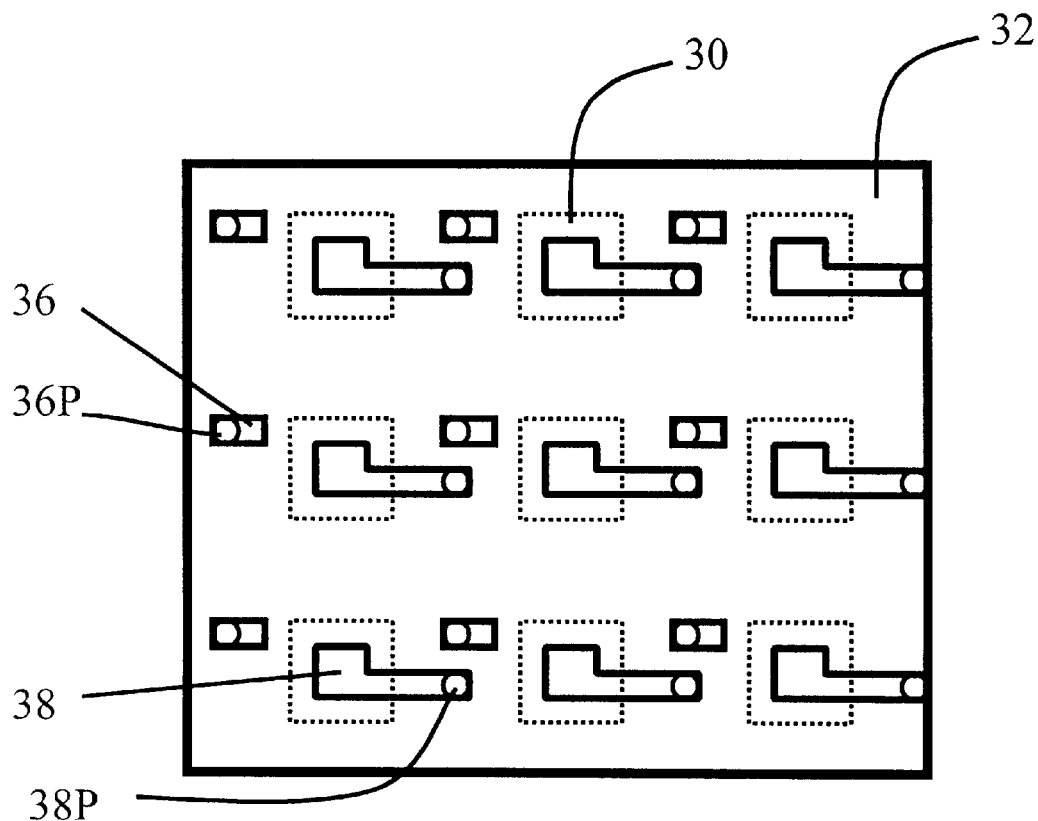
FIG. 3A shows the top view of the laser diode matrix with heating dissipating metal layer.

FIG. 3A shows a top view of a common substrate with metallic coating for heat sinking. The substrate 32 contains a large number of bonding pads for a matrix of laser diodes. The top of the substrate 32 has bonding pads 36 for connection to the first electrodes of the laser diodes E1 which are fed through plated-through conduits 36P to bottom contacts of the substrate, serving as extended input terminals to E1. The top of the substrate 32 also has bonding pads 38 for connection to the second electrodes of the laser diodes E2 which are fed through plated-through conduits 38P to other bottom contacts of the substrate 32, serving as extended input terminals to E2. This embodiment is different from FIG. 2B in that the bonding pad 38 has relatively large area for dissipating heat.

Figure 3B:
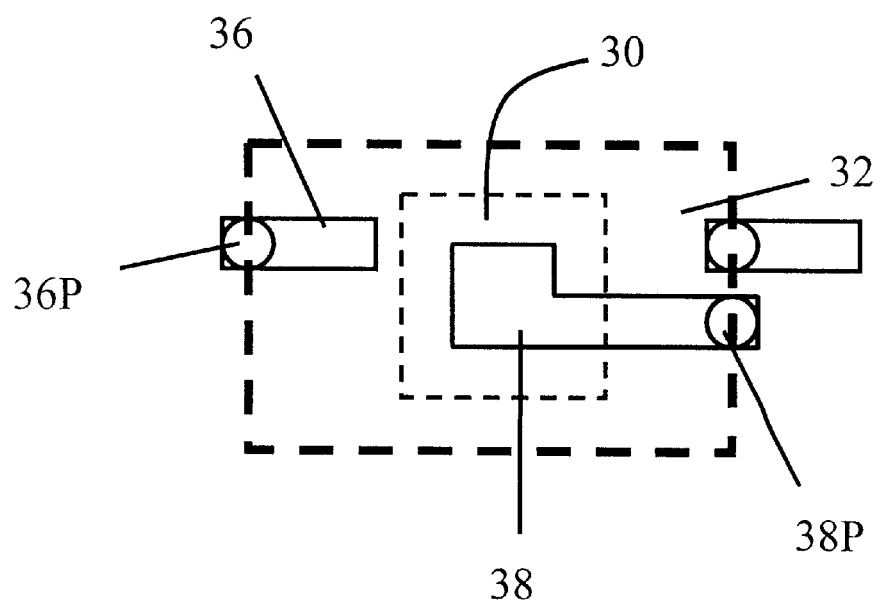
FIG. 3B shows an enlarged top view of a laser diode package shown in FIG. 3A.

FIG. 3B shows an enlarged view of one unit laser diode package shown in FIG. 3B. The top of the substrate 32 has a bonding pad 36 connected to the first electrode E1 of the laser diode 30 and extended to a bottom contact of the substrate 32 through the plated-through conduit 36P serving as the first input terminal to the laser diode The top of the substrate 32 also has a bonding pad 38 each flip-chip bonded to the bottom E2 of the laser diode and extended to another bottom contact of the substrate 32 through plated-through conduit 38P serving as a second extended input terminal to E2. The bonding pad 38 has a relatively large area to better heat sinking.

Figure 3C:
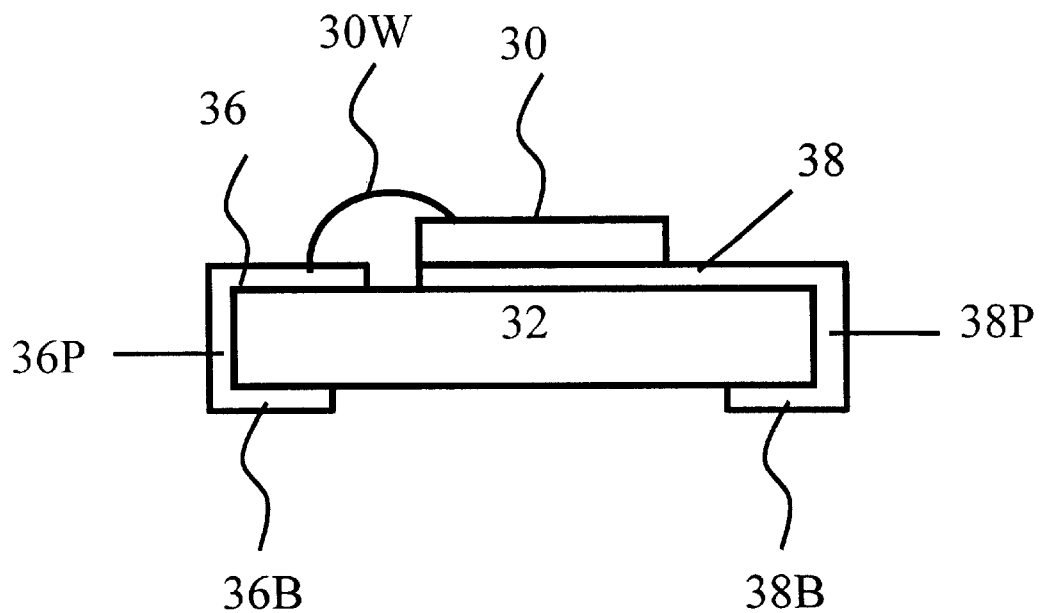
FIG. 3C shows a cross-sectional view of the laser diode package shown in FIG. 3B.

FIG. 3C is a cross-sectional view of FIG. 3B. This figure shows how the first bonding pad 36 is extended to the bottom side of the substrate 32 through the plated-through conduit 36P to become circuit contact 36B. Similarly, the second bonding pad 38 is extended to the bottom of the substrate 32 through the plated through conduit 38P to become circuit contact 38B.

Figure 4A:
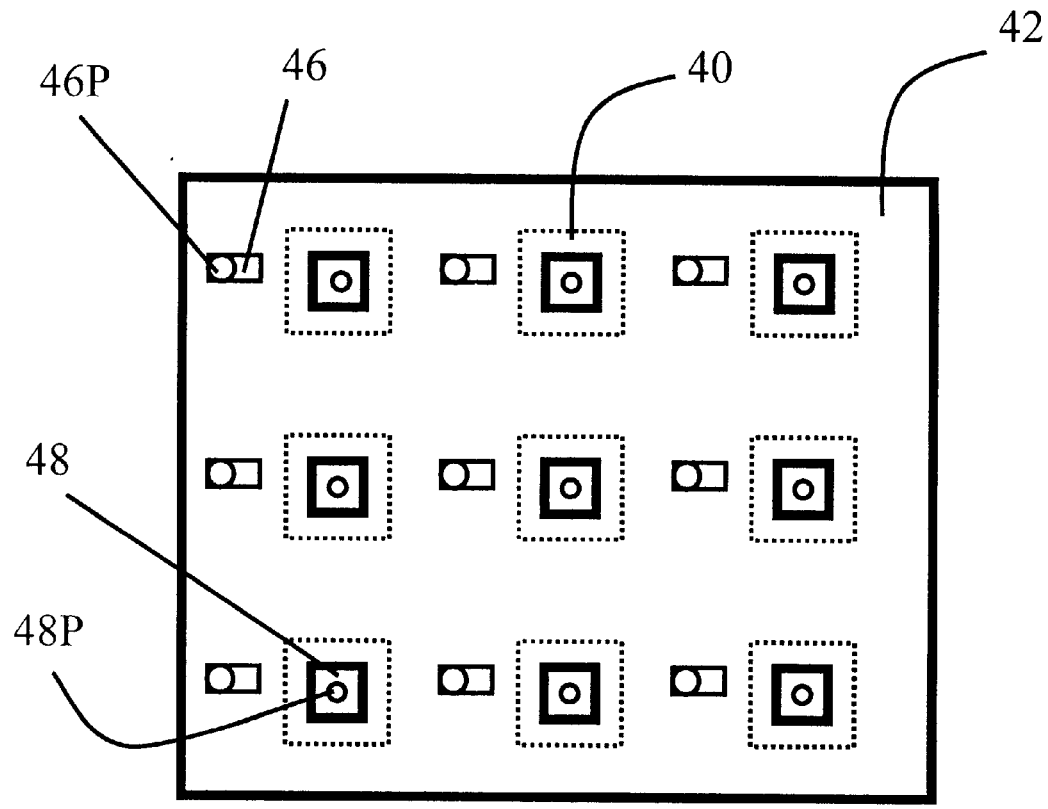
FIG. 4A shows the top view of the laser diode matrix having the heating dissipating metal serving as an electrode.

FIG. 4A shows the heat dissipating metal on the substrate serving as an bonding pad. The substrate 42 is plated with a large number of bonding pads for a matrix of laser diodes 40. The bonding pads 46 are for the first electrodes E1, which is connected to the other side of the substrate 42 through the plated-through conduits 46P, serving as the first extended input terminal. The substrate 42 also has bonding pads 48 for the second electrodes E2, which are connected to the other side of the substrate 42 through the plated-through holes 48P, serving as the second extended input terminals. The difference of this embodiment and that in FIG. 3A is that each plated-through hole 48P lies underneath the laser diode 40.

Figure 4B:
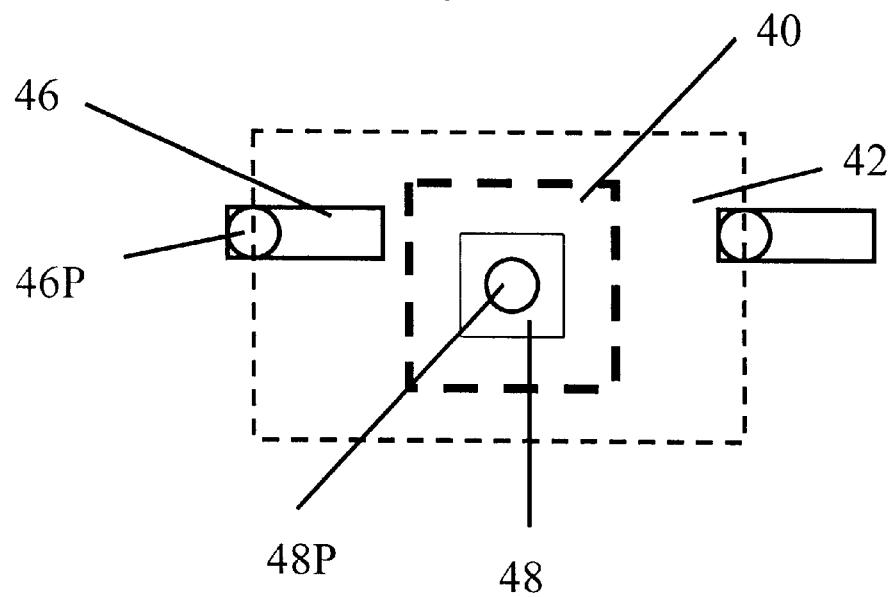
FIG. 4B shows the enlarged top view of the laser diode matrix shown in FIG. 4A.

FIG. 4B shows an enlarged view of a unit laser diode package shown in FIG. 4A. The substrate 42 has a bonding pad 46 which is connected to the E1 electrode of the laser diode 40 on the top side of the substrate 42 and extended through a plated-through conduit 46P to the bottom side of the substrate serving as the first extended input terminal. The substrate 42 also has bonding pad 48 connected to the E2 electrode of the laser diode 40 on the top side of the substrate 42 and extended through a plated-through hole 48P to the bottom side of the substrate serving as the second extended input terminal. The bonding pad 48 is placed underneath the laser diode 40.

Figure 4C:
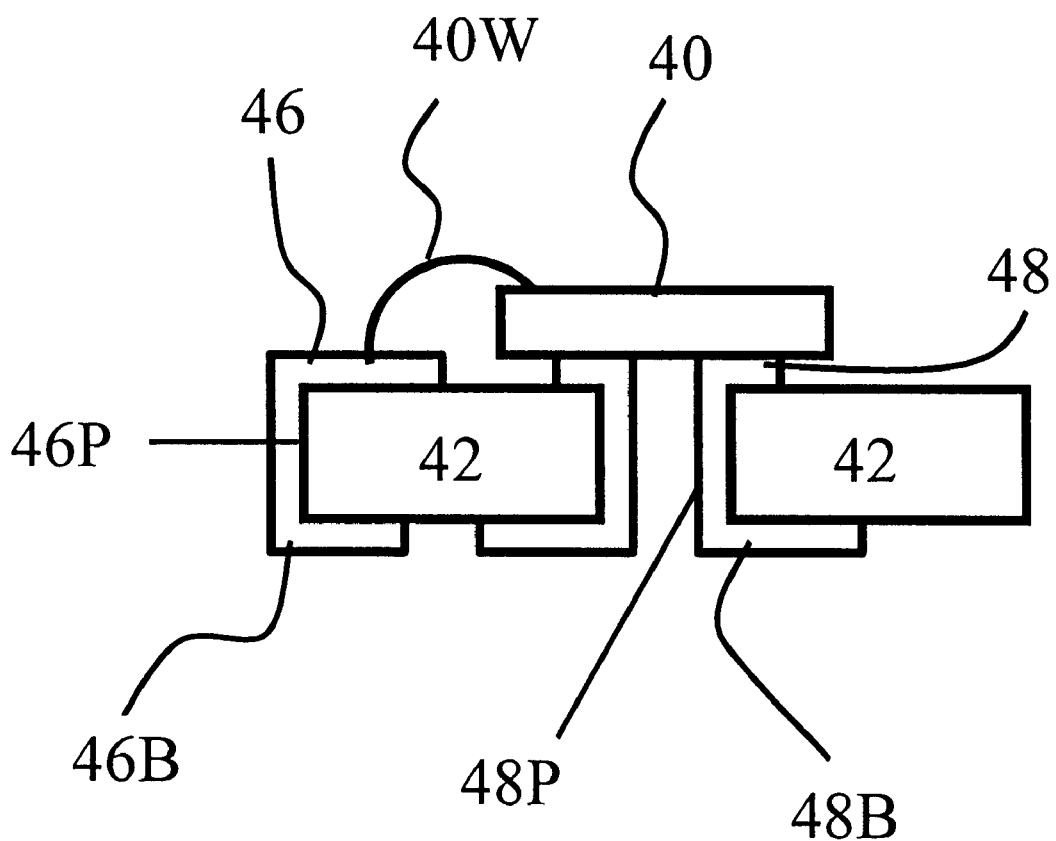
FIG. 4C shows the cross-sectional view of the laser diode package shown in FIG. 4B.

FIG. 4C shows the cross-sectional view of the structure shown in FIG. 4B. The first bonding pad 46 is extended through a plated-through conduit 46P to the other side of the substrate 42 to form circuit contact 46B. The second bonding pad 48 is fed through a plated-through hole 48P to the other side of the substrate 42 to form a circuit contact 48 B.

While the preferred embodiments of the invention have been shown are described, it will be apparent to those skilled in the art that various modification may be made in the embodiments without departing from the spirit of the present invention. Such modifications are all within the scope of this invention.

What is claimed is:

1. A surface mount package for a semiconductor laser diode having a first electrode on the top surface of said diode and a second electrode at the bottom surface of said diode, comprising
    a substrate on which said laser diode is mounted on a top surface of said substrate;
    a first plated-through conduit having a first end connected to a first bonding pad for bonding to said first electrode, and a second end connected to a first circuit contact at the bottom surface of said substrate; and
    a second plated-through conduit having one end connected to a second bonding pad for bonding to said second electrode, and a second end connected to a second circuit contact at the bottom surface of said substrate.

2. A surface mount package as described in claim 1, wherein said first bonding pad is wire bonded to said first electrode.

3. A surface mount package as described in claim 1, wherein said second bonding pad is flip-chip bonded to said second electrode.

4. A surface mount package as described in claim 1, wherein said first bonding pad and said second bonding pad are plated flat at the top surface of said substrate.

5. A surface mount package as described in claim 1, wherein said second bonding pad has a large enough area to serve as a heat sink.

6. A surface mount package for laser diode having a first electrode on thptop surface of said diode and a second electrode at the bottom surface of said diode, comprising,
    a substrate on which said laser diode is mounted on the top surface of said substrate;
    a first plated-through conduit having a first end connected to a first bonding pad for bonding to said first electrode, and a second end connected to a first circuit contact at the bottom of said substrate;
    second plated-through conduit having one end connected to a second circuit contact at the bottom surface of said substrate;
    four walls erected to enclose said laser diode; and
    a transparent cover resting on said walls.

7. A surface mount package as described in claim 6, wherein said cover is mounted with a lens.

8. A surface mount package as described in claim 7, wherein said lens is a focusing lens.

9. A surface mount package as described in claim 7, wherein said lens is a divergent lens.

10. A surface mount package for laser diode having a first electrode on the top surface of said diode and a second electrode at the bottom surface of said diode, comprising:
    a substrate on which said laser diode is mounted on the top of said substrate;
    first plated-through conduit having a first end connected to a first bonding pad for bonding to said first electrode, and a second end connected to a first circuit contact at the bottom of said substrate;
    a second plated-through conduit having one end connected to a second bonding pad for bonding to said second electrode, and a second end connected to a second circuit contact at the bottom surface of said substrate;
    wherein at least one of said first conduit and said second conduit are semicircular grooves along the side of said substrate.

11. A surface mount package as described in claim 10, wherein said first conduit is a groove along the side of said substrate, and said second conduit is a via hole beneath said laser diode.

12. A surface mount package as described in claim 10, wherein said first bonding pad is wire-bonded to said first electrode.

13. A surface mount package as described in claim 10, wherein said second bonding pad is flip-chip bonded to said second electrode.

14. A surface mount package as described in claim 10, wherein said first bonding pad and said second bonding pad are plated flat at the top surface of said substrate.

15. A surface mount package as described in claim 10, wherein said second bonding pad has a large enough area to serve as a heat sink.

* * * * *